(12) United States Patent
Li et al.

(10) Patent No.: US 12,231,102 B2
(45) Date of Patent: *Feb. 18, 2025

(54) AUDIO AMPLIFIER WITH EMBEDDED BUCK CONTROLLER FOR CLASS-G APPLICATION

(71) Applicant: STMicroelectronics (Shenzhen) R&D Co., Ltd., Shenzhen (CN)

(72) Inventors: XiangSheng Li, Shenzhen (CN); Ru Feng Du, Shenzhen (CN)

(73) Assignee: STMicroelectronics (Shenzhen) R&D Co. Ltd., Shenzhen (CN)

(*) Notice: Subject to any disclaimer, the term of this patent is extended or adjusted under 35 U.S.C. 154(b) by 0 days.

This patent is subject to a terminal disclaimer.

(21) Appl. No.: 18/493,282

(22) Filed: Oct. 24, 2023

(65) Prior Publication Data

US 2024/0056046 A1 Feb. 15, 2024

Related U.S. Application Data

(62) Division of application No. 17/241,980, filed on Apr. 27, 2021, now Pat. No. 11,831,286, which is a
(Continued)

(51) Int. Cl.
*H03G 3/30* (2006.01)
*H03F 3/187* (2006.01)
(Continued)

(52) U.S. Cl.
CPC ........... *H03G 3/3005* (2013.01); *H03F 3/187* (2013.01); *H04R 3/00* (2013.01); *H04R 29/00* (2013.01);
(Continued)

(58) Field of Classification Search
CPC .... H03F 1/0227; H03F 1/304; H03F 2200/03; H03F 2200/435; H03F 3/187;
(Continued)

(56) References Cited

U.S. PATENT DOCUMENTS 7,315,204 B2 1/2008 Seven
9,319,495 B2 4/2016 D'Souza et al.
(Continued)

FOREIGN PATENT DOCUMENTS

CN 101040434 A 9/2007
CN 211405976 U 9/2020
GB 2560045 A 8/2018

OTHER PUBLICATIONS

Texas Instruments, "TAS2553 2.8-W Class-D Mono Audio Amplifier with Class-G Boost and Speaker Sense", TAS2553, SLAS978B, Sep. 2013, 60 pages.

(Continued)

*Primary Examiner* — Lun-See Lao
(74) *Attorney, Agent, or Firm* — Slater Matsil, LLP

(57) ABSTRACT

An audio amplifier includes: a buck controller configured to control an output voltage at a first supply terminal, the output voltage selected from a set including a plurality of output voltages, where the output voltage takes a settling time to settle; a first audio bridge including: a class-AB driver stage coupled to the first supply terminal, and a delay insertion circuit configured to receive a processed digital stream and provide the processed digital stream to the class-AB driver stage a delay time after receiving the processed digital stream, where the delay time is based on the settling time; and an audio amplitude detector configured to detect a first peak amplitude in the first digital audio stream, where the buck controller is configured to select a lowest output voltage from the set that is higher than the first peak amplitude plus a headroom voltage.

20 Claims, 5 Drawing Sheets

Related U.S. Application Data division of application No. 16/695,010, filed on Nov. 25, 2019, now Pat. No. 11,018,644.

(60) Provisional application No. 62/771,967, filed on Nov. 27, 2018.

(51) Int. Cl.
    *H04R 3/00* (2006.01)
    *H04R 29/00* (2006.01)

(52) U.S. Cl.
    CPC ... *H03F 2200/03* (2013.01); *H03G 2201/103* (2013.01)

(58) Field of Classification Search
    CPC .......... H03F 3/3061; H03F 3/68; H03F 3/217; H03F 1/0222; H03F 2203/30078; H03F 2203/30111; H03F 2203/45631; H03F 3/3076; H03F 3/45094; H03G 2201/103; H03G 3/3005; H04R 29/00; H04R 3/00; H03L 5/00; H03L 7/099; H04L 27/2614; H04L 27/2626
    USPC ...................................................... 381/56–58
    See application file for complete search history.

(56) References Cited

U.S. PATENT DOCUMENTS

| | | | |
|---|---|---|---|
| 11,018,644 | B2 | 5/2021 | Li et al. |
| 11,831,286 | B2* | 11/2023 | Li ........................ H04R 29/00 |
| 2007/0018719 | A1* | 1/2007 | Seven .................. H03F 3/2173 |
| | | | 330/51 |
| 2008/0175420 | A1 | 7/2008 | Chung et al. |
| 2012/0056672 | A1 | 3/2012 | Galal et al. |
| 2015/0045095 | A1 | 2/2015 | D'Souza et al. |
| 2015/0244333 | A1 | 8/2015 | Drejer |
| 2017/0359041 | A1* | 12/2017 | Morley ................ H03F 3/4508 |
| 2018/0103313 | A1* | 4/2018 | Doy .................... H04R 29/001 |
| 2018/0248525 | A1* | 8/2018 | Orr ...................... H02M 3/1582 |
| 2019/0141446 | A1* | 5/2019 | Moritoki ................ H04R 3/007 |
| 2019/0166566 | A1* | 5/2019 | Wen ........................ H03F 3/187 |

OTHER PUBLICATIONS

Texas Instruments, "TAS2552 4.0-W Class-D Mono Audio Amplifier with Class-G Boost and Speaker Sense", TAS2552, SLAS898B, Jan. 2014, 62 pages.

Wen, Shon-Hang et al., "A 5.2mW, 0.0016% THD up to 20kHz, Ground-Referenced Audio Decoder with PSRR-enhanced Class-AB 160 Headphone Amplifiers", Symposium on VLSI Circuits Design of Technical Papers, Jun. 13-15, 2012, 2 pages.

\* cited by examiner

PRIOR ART

AUDIO AMPLIFIER WITH EMBEDDED BUCK CONTROLLER FOR CLASS-G APPLICATION

CROSS-REFERENCE TO RELATED APPLICATIONS

This application is a divisional of U.S. patent application Ser. No. 17/241,980, filed Apr. 27, 2021, which is a divisional of U.S. patent application Ser. No. 16/695,010, filed on Nov. 25, 2019, now issued as U.S. Pat. No. 11,018,644, which claims the benefit of U.S. Provisional Application No. 62/771,967, filed on Nov. 27, 2018, which applications are hereby incorporated by reference herein in their entirety.

TECHNICAL FIELD

The present disclosure relates generally to an electronic system and method, and, in particular embodiments, to an audio amplifier with embedded buck controller for class-G application.

BACKGROUND

Power amplifiers are classified based on the characteristics of the output stage. In particular, the classes are based on the proportion of each input cycle in which the output device passes current. Conventional class-A amplifiers are simpler than class-B and class-AB amplifiers and use a single amplifying transistor that is biased such that the amplifying transistor is always conducting. For differential class-A amplifiers, the biasing point is typically selected to be equal to the maximum output current to allow for the amplification of the full range of the input signal.

Conventional class-B amplifiers use two amplifying transistors, each operating for half a cycle, in a push-pull configuration. Because of the non-overlapping of the signals of each amplifying device, the class-B amplifier typically has high crossover distortion.

Conventional class-AB amplifiers have a push-pull configuration that operates for more than half a cycle. To operate, class-AB amplifiers use biasing circuits that are typically more complex than the biasing circuits of class-A or class-B amplifiers. The overlap helps reduce the crossover distortion present in class-B amplifiers at the expense of higher quiescent current.

FIG. 1 shows output stage 102 of conventional class-AB audio power amplifier 100 for driving audio speaker 106. A controller and gate drivers (not shown) control transistors 120, 122, 124, and 128 based on an audio input signal (which may be analog or digital).

A class-D amplifier is a switching amplifier that operates the output transistors as electronic switches instead of in the linear region. FIG. 2 shows a schematic diagram of conventional class-D amplifier 200 for driving audio speaker 106. Class-D amplifier includes comparator 202, drive circuit 204, output stage 205, inductor 210, and capacitor 212.

During normal operation, comparator 202 receives audio input signal 216 and triangular waveform 218 (e.g., a sawtooth waveform) and generates pulse-width modulation (PWM) signal 220. PWM signal 220 is used to control drive circuit 204, which drives transistors 206 and 208 of the output stage 205 based on PWM signal 220. Output stage 205 produces an output signal 222, which drives speaker 106 through the low pass filter (LPF) 209.

PWM signal 220 has a frequency typically higher than 20 kHz, causing the switching frequency of output signal 222 to also be above 20 kHz, which is above the human's audible range. LPF 209 generally filters out the switching noise generated by output signal 222.

SUMMARY

In accordance with an embodiment, an audio amplifier includes: a first supply terminal; a second supply terminal; a buck controller having a supply input configured to receive a battery voltage, the buck controller configured to control an output voltage at the first supply terminal, the output voltage being selected from a set including a plurality of output voltages, where the output voltage at the first supply terminal takes a settling time to settle when the buck controller changes the output voltage from a first voltage of the set to a second voltage of the set, the second voltage being higher than the first voltage; a first audio bridge having an input configured to receive a first digital audio stream and an output configured to be coupled to a first speaker, the first audio bridge including: a class-AB driver stage coupled to the first supply terminal and configured to be coupled to the first speaker, a digital signal processing circuit coupled to the input of the first audio bridge, and a delay insertion circuit configured to receive a processed digital stream from the digital signal processing circuit and configured to provide the processed digital stream to the class-AB driver stage a delay time after receiving the processed digital stream, where the delay time is based on the settling time; and an audio amplitude detector having an input coupled to the input of the first audio bridge and configured to detect a first peak amplitude in the first digital audio stream, where the buck controller is configured to select a lowest output voltage from the set that is higher than the first peak amplitude plus a headroom voltage.

In accordance with an embodiment, an integrated circuit including: a first supply terminal; a second supply terminal; a battery supply terminal; a buck controller having a supply input coupled to the battery supply terminal, the buck controller configured to control an output voltage at the first supply terminal, the output voltage being selected from a set including a plurality of output voltages, where the output voltage at the first supply terminal takes a settling time to settle when the buck controller changes the output voltage from a first voltage of the set to a second voltage of the set, the second voltage being higher than the first voltage; a first audio bridge having an input configured to receive a first digital audio stream and an output configured to be coupled to a first speaker, the first audio bridge including: a class-AB driver stage coupled to the first supply terminal and configured to be coupled to the first speaker, a digital signal processing circuit coupled to the input of the first audio bridge, and a delay insertion circuit configured to receive a processed digital stream from the digital signal processing circuit and configured to provide the processed digital stream to the class-AB driver stage a delay time after receiving the processed digital stream, where the delay time is based on the settling time; and an audio amplitude detector having an input coupled to the input of the first audio bridge and configured to detect a first peak amplitude in the first digital audio stream, where the buck controller is configured to select a lowest output voltage from the set that is higher than the first peak amplitude plus a headroom voltage.

In accordance with an embodiment, a method includes: receiving a first digital audio stream; detecting a first peak amplitude in the first digital audio stream; selecting an output voltage of a buck converter so that the output voltage is a lowest output voltage from a set of buck output voltages that is higher than the first peak amplitude plus a headroom voltage; converting the first digital audio stream into an analog audio signal; and providing the analog audio signal to a speaker using a class-AB driver stage a delay time after the output voltage of the buck converter settles, where the class-AB driver stage receives power from the buck converter.

BRIEF DESCRIPTION OF THE DRAWINGS

For a more complete understanding of the present invention, and the advantages thereof, reference is now made to the following descriptions taken in conjunction with the accompanying drawings, in which.

Corresponding numerals and symbols in different figures generally refer to corresponding parts unless otherwise indicated. The figures are drawn to clearly illustrate the relevant aspects of the preferred embodiments and are not necessarily drawn to scale.

DETAILED DESCRIPTION OF ILLUSTRATIVE EMBODIMENTS

The making and using of the embodiments disclosed are discussed in detail below. It should be appreciated, however, that the present invention provides many applicable inventive concepts that can be embodied in a wide variety of specific contexts. The specific embodiments discussed are merely illustrative of specific ways to make and use the invention, and do not limit the scope of the invention.

The description below illustrates the various specific details to provide an in-depth understanding of several example embodiments according to the description. The embodiments may be obtained without one or more of the specific details, or with other methods, components, materials and the like. In other cases, known structures, materials, or operations are not shown or described in detail so as not to obscure the different aspects of the embodiments. References to "an embodiment" in this description indicate that a particular configuration, structure or feature described in relation to the embodiment is included in at least one embodiment. Consequently, phrases such as "in one embodiment" that may appear at different points of the present description do not necessarily refer exactly to the same embodiment. Furthermore, specific formations, structures, or features may be combined in any appropriate manner in one or more embodiments.

Embodiments of the present invention will be described in a specific context, a digital audio amplifier with a plurality of outputs. Embodiments of the present invention may be used in other circuits, such as audio amplifiers with a single output, as well as for amplifiers that reproduce non-audio signals, for example.

In an embodiment of the present invention, a class-AB amplifier with an embedded buck converter is used in a class-G configuration to achieve lower power consumption, e.g., during light loads. An audio amplitude detector is used to monitor the amplitude of a digital audio stream delivered to a bridge, where the bridge is coupled to a speaker. The buck converter, which provides power to the bridge, increases or decreases the output voltage of the buck converter to the lowest voltage which provides enough headroom for the bridge to drive the speaker without clamping or distortion. A delay is introduced in the audio signal processing chain inside the bridge to allow enough settling time for the buck converter to reach a desired output.

Figure 3:
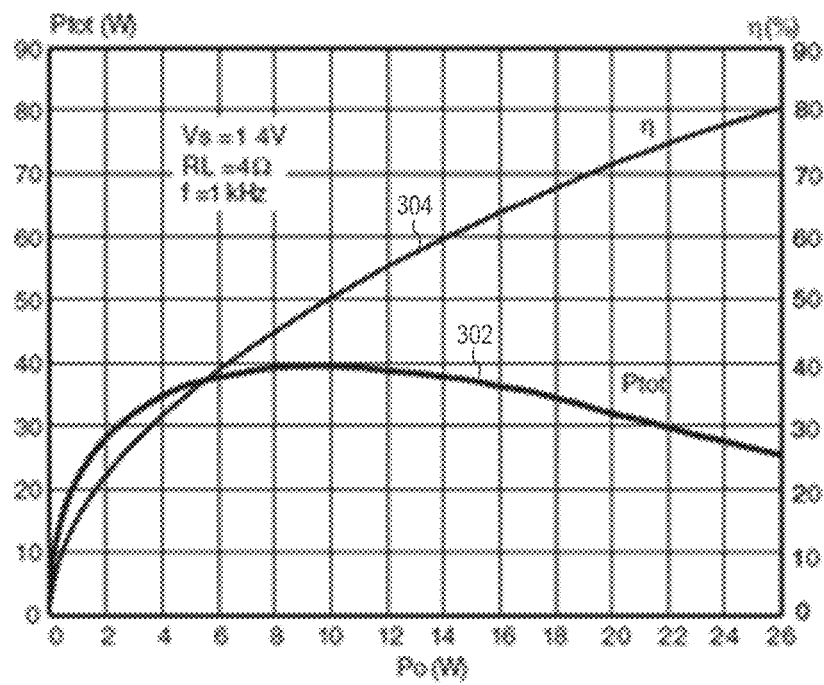
FIG. 3 shows a curves illustrating the power consumption Ptot of the internal components of a conventional class-AB amplifier and corresponding efficiency η, respectively, as a function of output power P0.

Conventional power audio amplifiers are typically implemented using class-D amplifiers instead of class-AB amplifiers to reduce power consumption. Although class-D amplifiers may use more expensive external components and may have worse electromagnetic interference (EMI) profile than class-AB amplifiers, class-D amplifiers are generally much more efficient than class-AB amplifiers. For example, FIG. 3 shows curve 302 and 304 illustrating the power consumption Ptot of the internal components of a conventional class-AB amplifier and corresponding efficiency η, respectively, as a function of output power P0.

Figure 4:
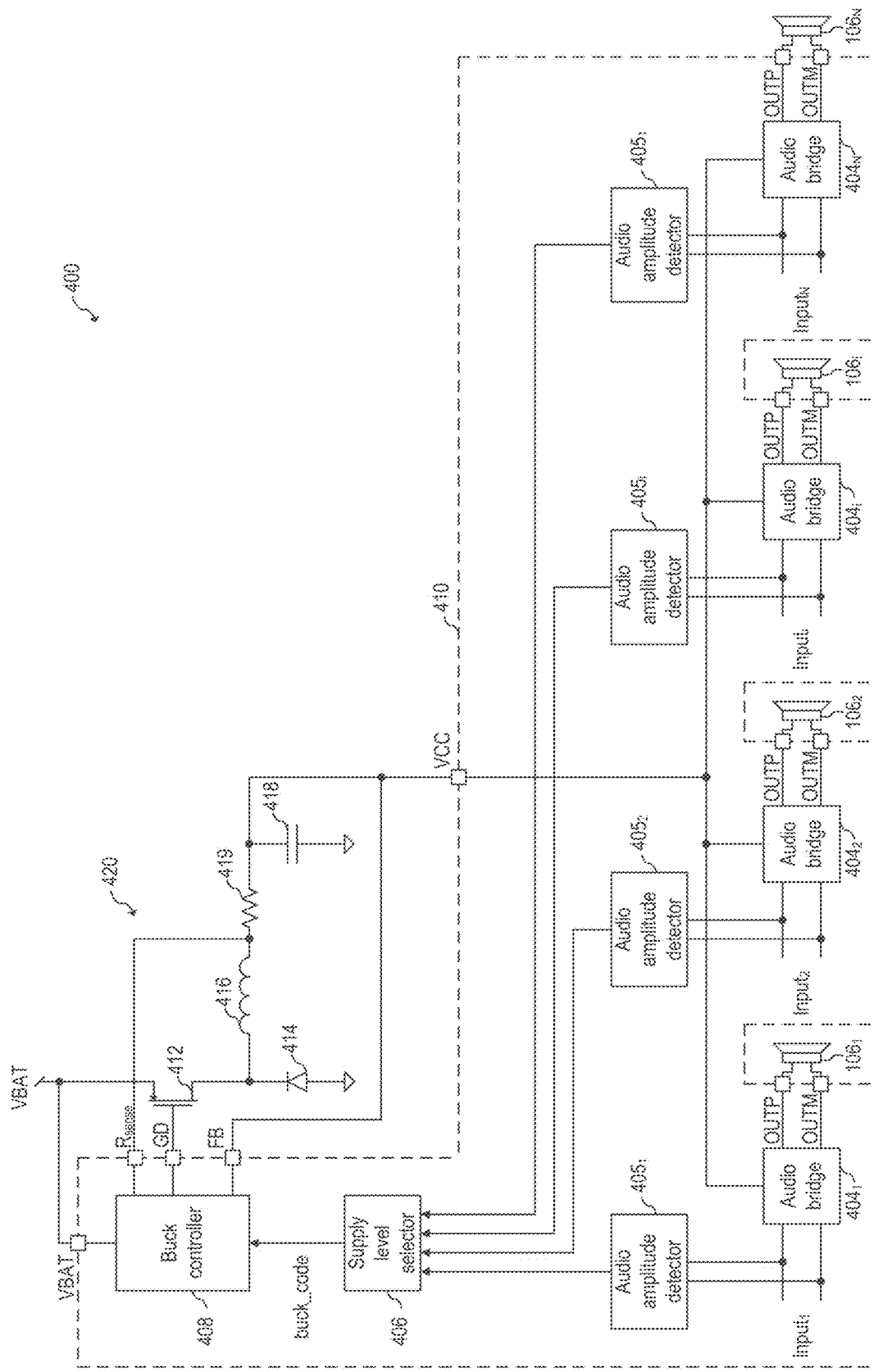
FIG. 4 shows a digital input class-AB audio power amplifier with an embedded buck controller, operating in a class-G configuration, according to an embodiment of the present invention.

FIG. 4 shows digital input class-AB audio power amplifier 400 with embedded buck controller 408, operating in a class-G configuration, according to an embodiment of the present invention. As shown in FIG. 4, digital input class-AB audio power amplifier 400 has N channels that receive N digital audio inputs (Input$_1$, Input$_2$, . . . , Input$_i$, . . . , Input$_N$) and drive N corresponding speakers (106$_1$, 106$_2$, . . . , 106$_i$, . . . , 106$_N$) with respective outputs (OUTP, OUTM) of respective audio bridges (404$_1$, 404$_2$, . . . , 404$_i$, . . . , 404$_N$), where N is a positive integer greater or equal to 1. In some embodiments, digital input class-AB audio power amplifier 400 with embedded buck controller 408 and the N audio bridges 404, e.g., may be implemented in integrated circuit 410 in a single package having, e.g., and in a monolithic substrate.

As shown in FIG. 4, buck converter 420 includes embedded buck controller 408, transistor 412, Schottky diode 414, and output capacitor 418. Buck converter 420 receives power from power supply VBAT, which may be a battery of a car or a cellphone, for example, and delivers supply voltage VCC to audio bridge(s) 404. In some embodiments, buck converter 420 is capable of providing up to 40 A at 18

V supply level. In some embodiments, buck converter 420 may provide even higher power. Other embodiments may have maximum power capabilities lower than 40 A at 18 V.

During normal operation, Buck converter 420 provides power to audio bridge(s) 404, e.g., via VCC terminal. Digital input class-AB audio power amplifier 400 receives digital input(s) ($Input_1 \ldots Input_N$), e.g., from an external circuit (e.g., controller, memory, bus, etc.) or from another circuit inside integrated circuit 410. The digital input(s) are provided to respective audio bridge(s) 404. Audio bridge(s) 404 generate an output (audio) signal at their respective outputs (OUTP, OUTM) based on the respective digital input (Input).

Audio amplitude detector(s) 405 monitors the digital input of the corresponding audio bridge 404 and predicts the output signal amplitude the corresponding audio bridge would produce at the respective outputs (OUTP, OUTM). Audio amplitude detector 405 may be implemented, for example, in the digital domain and may monitor the real-time input digital signal. Audio amplitude detector(s) 405 provide, e.g., the peak amplitude of the predicted output signal to supply level selector 406.

Supply level selector 406 receives the peak amplitude of the predicted output signal from the audio amplitude detector(s) 405 and selects an output voltage level for buck converter 420 (e.g., using buck_code) based on the received peak amplitude(s). For example, in some embodiments, the supply level selector 406 configures buck converter 420 to have an output voltage that is the lowest voltage that is higher than the highest received peak amplitude (plus a headroom voltage).

Figure 5:
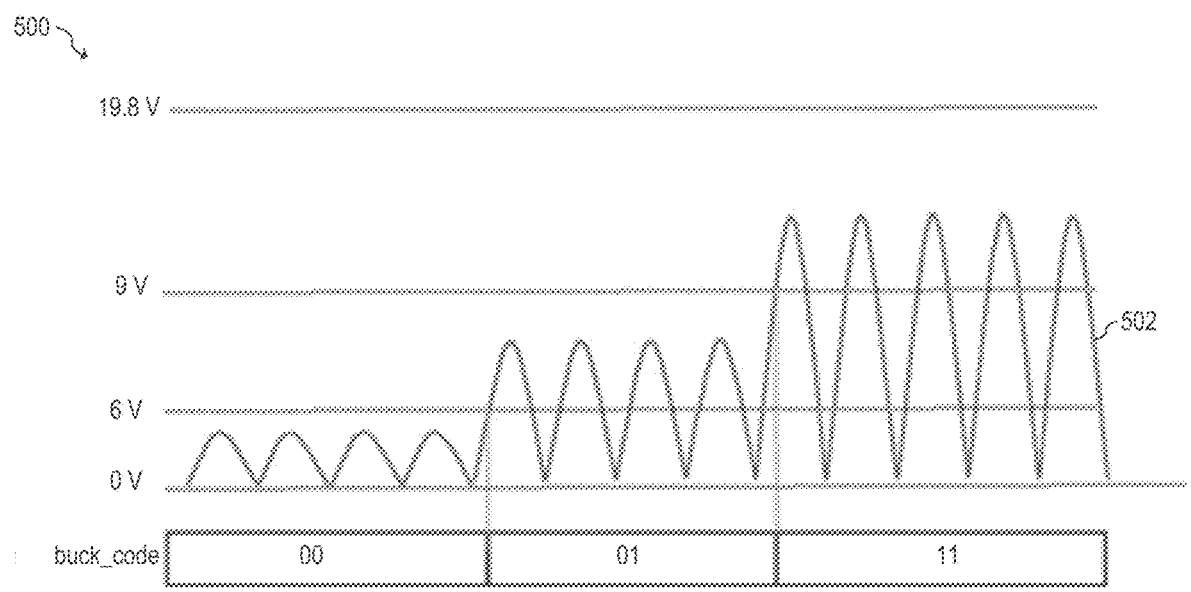
FIG. 5 shows a graph of an audio output (delivered to a speaker), respective buck converter setting code fed to the buck converter of FIG. 4, and corresponding output level of the buck converter of FIG. 4, according to an embodiment of the present invention.

FIG. 5 shows graph 500 of audio output curve 502 (delivered, e.g., to a speaker by an audio bridge 404), respective buck_code setting code fed to buck converter 420, and corresponding output level of buck converter 420, according to an embodiment of the present invention. For the sake of simplicity, it is assumed that audio output curve 502 represents the highest voltage peaks from all N channels of digital input class-AB audio power amplifier 400.

As shown in FIG. 5, the output of buck converter 420 is adjusted to the lowest voltage that provides enough headroom for the output signals (OUTP, OUTM) of the audio bridge 4040 to drive the corresponding speaker 106, e.g., based on the predicted output signal amplitude or the amplitude of the digital audio stream delivered to the audio bridge 404.

For example, in some embodiments, buck converter 420 may have three different output levels (e.g. 8 V for buck_code 00, 11 V for buck_code 01, and VBAT for buck_code 11). When the output audio signal (curve 502) has a peak below the lowest level (e.g., 6 V) the buck_code 00, corresponding to 8 V output of buck converter 420, is selected. When the output audio signal has a peak above the lowest level (e.g., 6 V) but below the second to lowest level (e.g., 9 V) the buck_code 01, corresponding to 11 V output of the buck converter, is selected. When the output audio signal has a peak above the lowest level (e.g., 6 V) and the second to lowest level (e.g., 9 V) the buck_code 11, corresponding to VBAT output of buck converter 420, is selected.

In this embodiment, a 2 V headroom voltage is assumed. For example, an 8 V VCC is used when the peak voltage is lower than 6 V). In some embodiments, a different headroom voltage, such as smaller than 2 V or higher than 2V, may be used.

Other output levels for buck converter 420 may be used. As another non-limiting example, some embodiments may use 6 V, 9 V, and VBAT as the output levels corresponding to buck codes 00, 01, and 11, respectively. Other output levels may be used.

Some embodiments may have only two output levels for the buck converter. Other embodiments may have more than three possible output levels for the buck converter.

Some embodiments may implement the output voltage selection using a digital-to-analog converter (DAC). Other implementations are also possible.

In some embodiments, all of the N channels of digital input class-AB audio power amplifier 400 are monitored, and the output of buck converter 420 is set to the lowest level that provides enough headroom to all of the N channels. For example, in an embodiment, if channel one has a peak amplitude of 11 V but the other N−1 channels have a peak amplitude of less than 6 V, the VBAT setting is selected for buck converter 420.

Figure 6:
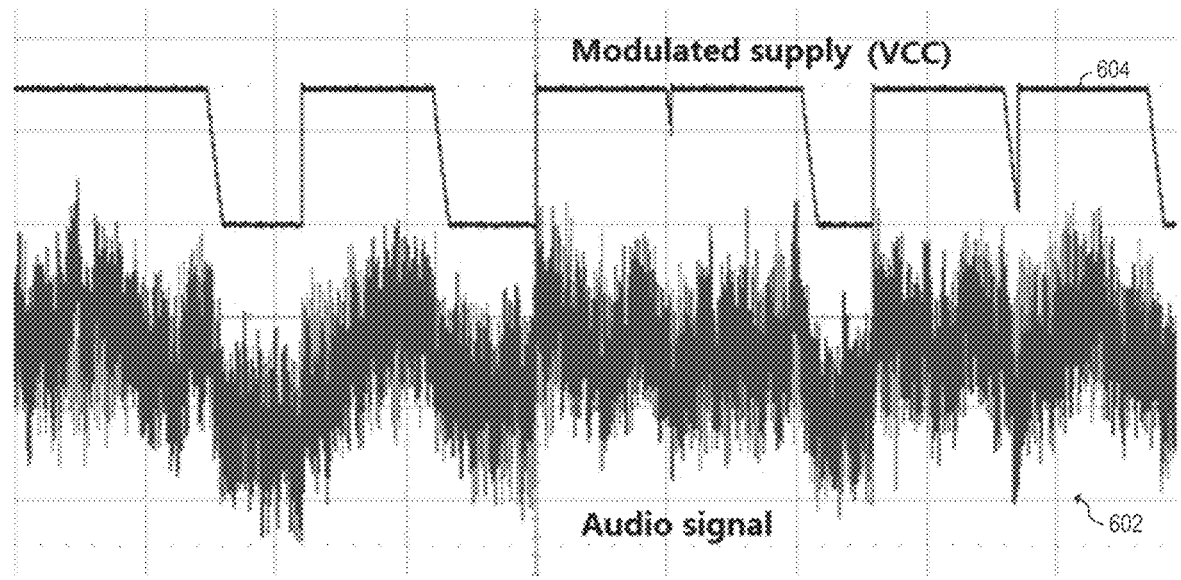
FIG. 6 shows an audio signal and corresponding modulated supply VCC, where VCC is provided by the buck converter of FIG. 4, according to an embodiment of the present invention.

FIG. 6 shows audio signal 602 (from outputs OUTP, OUTM of an audio bridge 404) and corresponding modulated supply VCC (curve 604), where VCC is provided by buck converter 420, according to an embodiment of the present invention. As shown in FIG. 6, the supply VCC (curve 604) goes low when the audio signal (curves 602) go low, and goes high when the audio signal goes high, thereby advantageously allowing enough headroom to avoid clamping or otherwise distorting the audio signal while keeping the VCC voltage low.

Figure 7:
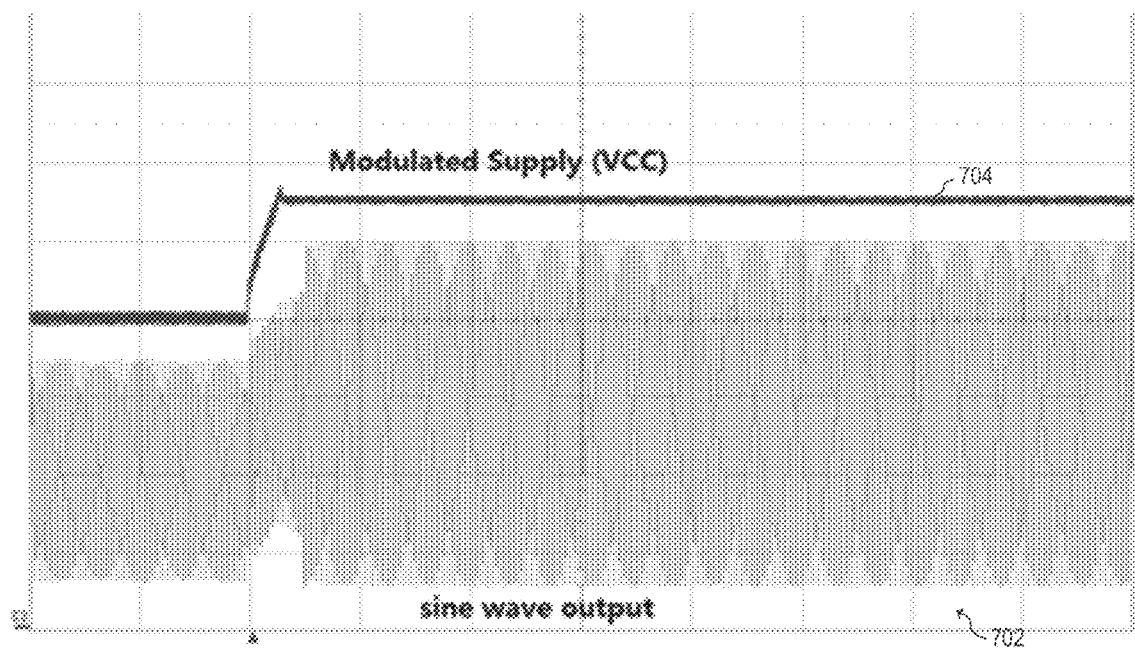
FIG. 7 shows an audio signal (sinewave) and corresponding modulated supply VCC, where VCC is provided by the buck converter of FIG. 4, according to an embodiment of the present invention.

FIG. 7 shows audio signal 702 (sinewave) and corresponding modulated supply VCC (curve 604), where VCC is provided by buck converter 420, according to an embodiment of the present invention.

Figure 8:
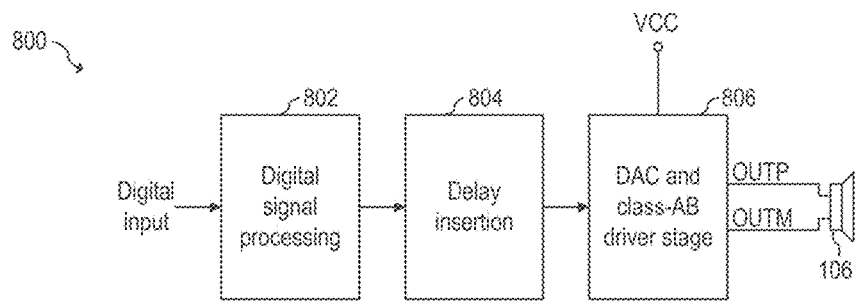
FIG. 8 shows a schematic diagram of an audio bridge, according to an embodiment of the present invention.

As shown in FIGS. 4-7, buck converter 420 adjusts the buck output voltage VCC based on the digital audio inputs ($Input_1 \ldots Input_N$). When it is determined that the buck output voltage VCC of buck converter 420 should rise, the buck output voltage VCC should rise before the audio output signal is delivered to speaker 106. Some embodiments, therefore, insert a delay in the signal processing path of each audio bridge to allow the buck output voltage VCC to settle before the audio output reaches the speaker. For example, FIG. 8 shows a schematic diagram of audio bridge 800, according to an embodiment of the present invention. Audio bridge 800 is a possible implementation of audio bridge 404.

Figure 1:
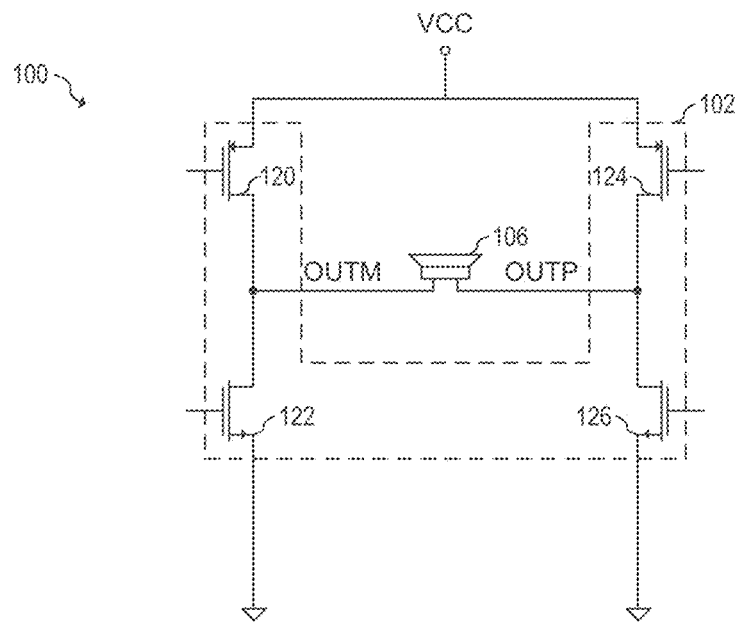
FIG. 1 shows an output stage of conventional class-AB audio power amplifier for driving an audio speaker, and a load current sensor circuit for sensing a load current flowing through the audio speaker.
Figure 2:
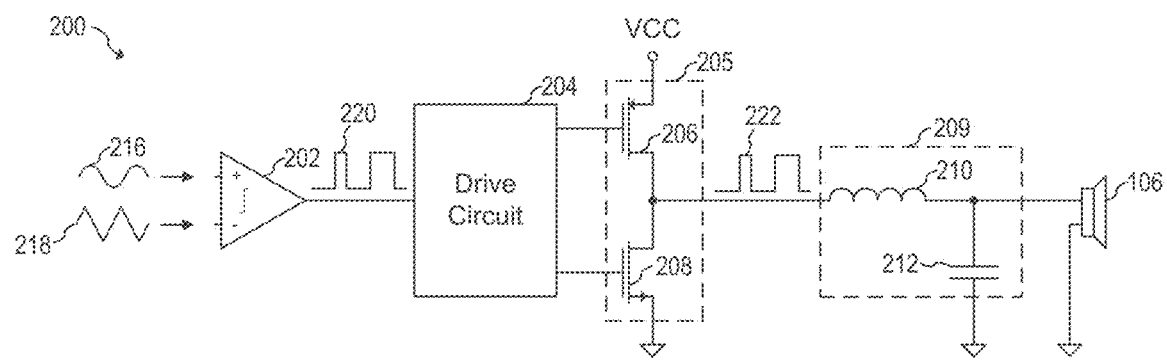
FIG. 2 shows a schematic diagram of a conventional class-D amplifier for driving the audio speaker.

As shown in FIG. 8 the Digital Input (e.g., any of $Input_1 \ldots Input N$) is processed by the digital signal processing circuit 802. A delay is inserted by delay insertion circuit 804 (e.g., in the digital domain). A DAC is then used together with a class-AB driver (such as shown in FIG. 1) to drive the corresponding speaker 106. In some embodiments, the delay inserted by the delay insertion circuit 804 is determined based on the settling time of buck converter 420. Since all digital inputs are experiencing the same delay, no audio interruptions or distortion is experienced by a listener.

In some embodiments, the settling time of buck converter 420 is determined as the time from change in the output voltage (e.g., change in buck_code) until voltage VCC is within, e.g., 5% of the target output voltage. Other tolerances, such as 7% or higher, or 2% or lower, may also be used. In some embodiment, the settling time may differ depending on the start buck_code and the end buck_code. In such embodiments, the settling time used by delay insertion circuit 804 may be the longest settling time of the possible settling times of the buck converter 420. In some embodiments, the settling time used by delay insertion circuit 804 may be longer than the longest settling time of the possible settling times of the buck converter 420.

Figure 9:
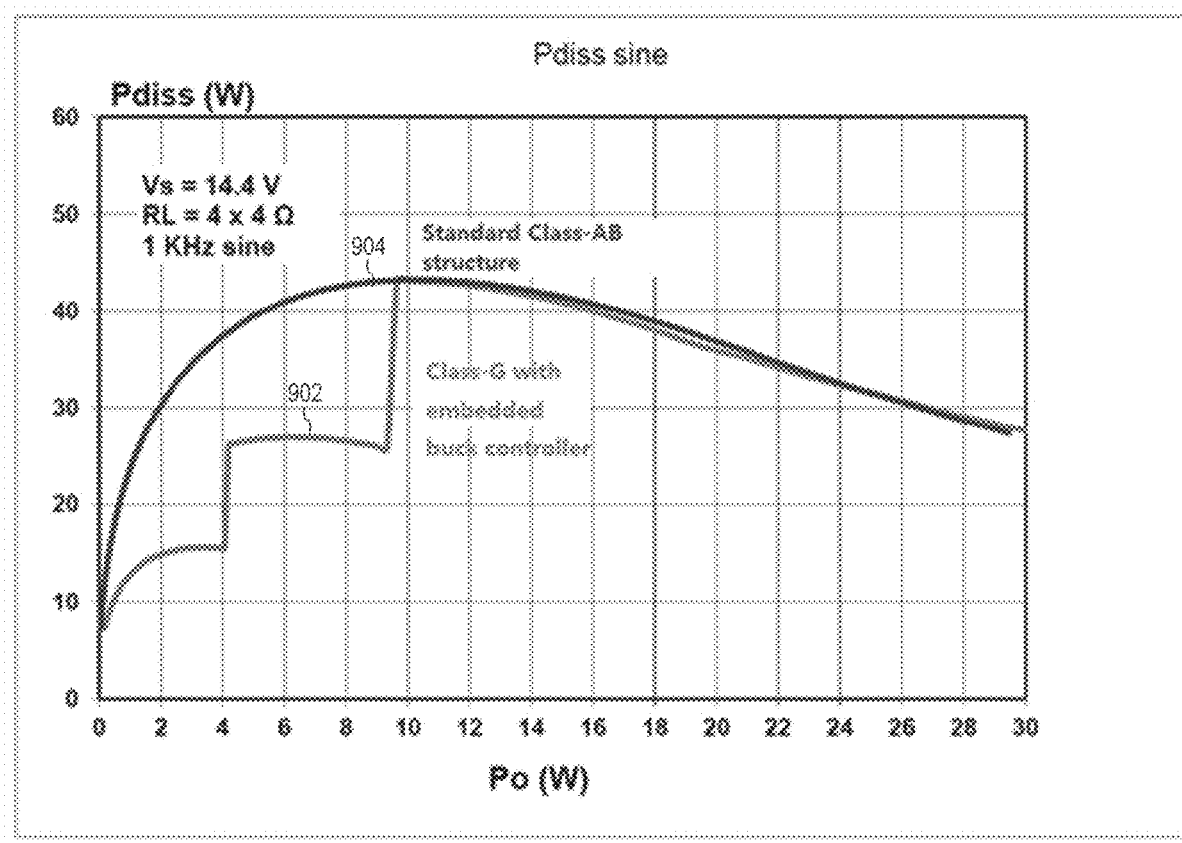
FIG. 9 shows a curve illustrating the power consumption of the internal components of a conventional class-AB amplifier, and a curve illustrating the power consumption of the internal components of a class-AB amplifier with embedded buck converter operating in a class-G configuration, according to the present invention.

Advantages of some embodiments include a reduction in power consumption compared to conventional class-AB implementations. For example, FIG. 9 shows curve 904 illustrating the power consumption of the internal components of a conventional class-AB amplifier, and curve 902 illustrating the power consumption of the internal components of a class-AB amplifier with embedded buck converter operating in a class-G configuration, according to the present invention. As shown, the class-AB amplifier with embedded buck converter operating in a class-G configuration (e.g., such as digital input class-AB audio power amplifier 400 with embedded buck controller 408) consumes significantly less power than a conventional class-AB amplifier during light loads. In some embodiments, the dissipated power under average listening conditions may be reduced up to 50% when compared to conventional class-AB amplifiers.

Buck converter 420 may be implemented in various ways. For example, in some embodiments buck (step-down) converter 420 generates a regulated voltage VCC by driving the control terminal of transistor 412 (at terminal GD) with a pulse-width modulation (PWM) signal that is based on the feedback voltage (at terminal FB). The feedback voltage may be divided using a voltage divider (not shown) and then compared with a reference voltage (not shown) to generate the PWM signal. In some embodiments, the code buck_code changes the voltage divider to adjust the output voltage generated by converter 420 at terminal VCC. Other implementations are also possible.

In some embodiments, a transistor may be used instead of Schottky diode 414. In some embodiments, current may be sensed directly in an output transistor (e.g., transistor 412 or a low-side transistor replacing Schottky diode 414), and sense resistor 419 may be omitted. Other implementations are also possible.

Supply level selector 406 may include a digital comparator that compares the digital representation of the maximum voltage peak received from the N audio amplitude detectors 405, e.g., in a predetermined window of time and selects, e.g., based on a look-up table (LUT) storing the set of possible buck codes, the buck_code that corresponds to the lowest VCC voltage that has enough headroom for the maximum voltage peak received. Other implementations are also possible.

Audio amplitude detector(s) 405 may be implemented, e.g., using digital logic, including registers, to store or send to supply level selector 406 the digital representation of the maximum peak voltage detected from the respective input, e.g., in a predetermined window of time. Other implementations are also possible.

Speaker 106 may be implemented in any way known in the art. For example, in some embodiments, speaker 106 may have a 4Ω impedance. Other implementations are also possible.

Digital signal processing circuit 802 may be implemented as a custom or general-purpose processor, digital signal processor (DSP), or controller. Other implementations are also possible.

Delay insertion circuit 804 may be implemented, e.g., by gating a clock used to send information from digital signal processing circuit 802 to DAC and class-AB driver stage 806. Other implementations are also possible.

Although FIG. 8 shows that each audio bridge Boo includes a digital signal processing circuit 802 and a delay insertion circuit 804, it is understood that, in some embodiments, a centralized controller, processor, or DSP may implement all of the digital signal processing circuits 802 or all of the delay insertion circuits 804.

In some embodiments, the delay for processing the digital input by the digital signal processing circuit 802 may be longer than the settling time of buck converter 420. In such embodiments, delay insertion circuit 804 may be optional.

DAC and class-AB driver stage 806 may be implemented with a conventional DAC (e.g., using R2R ladder, delta-sigma modulation, or other), and a conventional class-AB driver stage, such as using a controller to control a full-bridge, such as full-bridge 102.

Example embodiments of the present invention are summarized here. Other embodiments can also be understood from the entirety of the specification and the claims filed herein.

Example 1

An audio amplifier including: a first supply terminal; a second supply terminal; a buck controller having a supply input configured to receive a battery voltage, the buck controller configured to control an output voltage at the first supply terminal, the output voltage being selected from a set including a plurality of output voltages, where the output voltage at the first supply terminal takes a settling time to settle when the buck controller changes the output voltage from a first voltage of the set to a second voltage of the set, the second voltage being higher than the first voltage; a first audio bridge having an input configured to receive a first digital audio stream and an output configured to be coupled to a first speaker, the first audio bridge including: a class-AB driver stage coupled to the first supply terminal and configured to be coupled to the first speaker, a digital signal processing circuit coupled to the input of the first audio bridge, and a delay insertion circuit configured to receive a processed digital stream from the digital signal processing circuit and configured to provide the processed digital stream to the class-AB driver stage a delay time after receiving the processed digital stream, where the delay time is based on the settling time; and an audio amplitude detector having an input coupled to the input of the first audio bridge and configured to detect a first peak amplitude in the first digital audio stream, where the buck controller is configured to select a lowest output voltage from the set that is higher than the first peak amplitude plus a headroom voltage.

Example 2

The audio amplifier of example 1, where the headroom voltage is 2 V or lower.

Example 3

The audio amplifier of one of examples 1 or 2, where the set includes three output voltages.

Example 4

The audio amplifier of one of examples 1 to 3, where an output voltage of the set is the battery voltage.

Example 5

The audio amplifier of one of examples 1 to 4, where the second supply terminal is coupled to ground.

Example 6

The audio amplifier of one of examples 1 to 5, further including: a high-side transistor coupled between the supply input of the buck controller and an intermediate node; a diode coupled between the second supply terminal and the intermediate node; and an inductor coupled between the intermediate node and the input of the first audio bridge.

Example 7

The audio amplifier of one of examples 1 to 6, where the buck controller, the first audio bridge are integrated in an integrated circuit, and where the high-side transistor, the diode, and the inductor are external to the integrated circuit.

Example 8

The audio amplifier of one of examples 1 to 7, further including a low-side transistor that includes the diode.

Example 9

The audio amplifier of one of examples 1 to 8, where the diode is a Schottky diode.

Example 10

The audio amplifier of one of examples 1 to 9, further including: a second audio bridge having an input configured to receive a second digital audio stream and an output configured to be coupled to a second speaker, the second audio bridge including: a second class-AB driver stage coupled to the first supply terminal and configured to be coupled to the second speaker, a second digital signal processing circuit coupled to the input of the second audio bridge, and a second delay insertion circuit configured to receive a second processed digital stream from the digital signal processing circuit and configured to provide the second processed digital stream to the class-AB driver stage a second delay time after receiving the processed digital stream, where the second delay time based on the settling time; and a second audio amplitude detector having an input coupled to the input of the second audio bridge and configured to detect a second peak amplitude in the second digital audio stream, where the buck controller is configured to select a lowest output voltage from the set that is higher than the first peak amplitude plus the headroom voltage and is higher than the second peak amplitude plus the headroom voltage.

Example 11

The audio amplifier of one of examples 1 to 10, where the delay time is higher than or equal to the settling time.

Example 12

An integrated circuit including: a first supply terminal; a second supply terminal; a battery supply terminal; a buck controller having a supply input coupled to the battery supply terminal, the buck controller configured to control an output voltage at the first supply terminal, the output voltage being selected from a set including a plurality of output voltages, where the output voltage at the first supply terminal takes a settling time to settle when the buck controller changes the output voltage from a first voltage of the set to a second voltage of the set, the second voltage being higher than the first voltage; a first audio bridge having an input configured to receive a first digital audio stream and an output configured to be coupled to a first speaker, the first audio bridge including: a class-AB driver stage coupled to the first supply terminal and configured to be coupled to the first speaker, a digital signal processing circuit coupled to the input of the first audio bridge, and a delay insertion circuit configured to receive a processed digital stream from the digital signal processing circuit and configured to provide the processed digital stream to the class-AB driver stage a delay time after receiving the processed digital stream, where the delay time is based on the settling time; and an audio amplitude detector having an input coupled to the input of the first audio bridge and configured to detect a first peak amplitude in the first digital audio stream, where the buck controller is configured to select a lowest output voltage from the set that is higher than the first peak amplitude plus a headroom voltage.

Example 13

The integrated circuit of example 12, further including: a second audio bridge having an input configured to receive a second digital audio stream and an output configured to be coupled to a second speaker, the second audio bridge including: a second class-AB driver stage coupled to the first supply terminal and configured to be coupled to the second speaker, a second digital signal processing circuit coupled to the input of the second audio bridge, and a second delay insertion circuit configured to receive a second processed digital stream from the digital signal processing circuit and configured to provide the second processed digital stream to the class-AB driver stage a second delay time after receiving the processed digital stream, where the second delay time is equal to the delay time; and a second audio amplitude detector having an input coupled to the input of the second audio bridge and configured to detect a second peak amplitude in the second digital audio stream, where the buck controller is configured to select a lowest output voltage from the set that is higher than the first peak amplitude plus the headroom voltage and is higher than the second peak amplitude plus the headroom voltage.

Example 14

A method including: receiving a first digital audio stream; detecting a first peak amplitude in the first digital audio stream; selecting an output voltage of a buck converter so that the output voltage is a lowest output voltage from a set of buck output voltages that is higher than the first peak amplitude plus a headroom voltage; converting the first digital audio stream into an analog audio signal; and providing the analog audio signal to a speaker using a class-AB driver stage a delay time after the output voltage of the buck converter settles, where the class-AB driver stage receives power from the buck converter.

Example 15

The method of example 14, where the set includes three buck output voltages.

Example 16

The method of one of examples 14 or 15, where a first output voltage of the set is equal to a battery voltage received by the buck converter.

Example 17

The method of one of examples 14 to 16, where the headroom voltage is 2 V or lower.

Example 18

The method of one of examples 14 to 17, further including: receiving a second digital audio stream; detecting a second peak amplitude in the second digital audio stream; and selecting an output voltage of the buck converter so that the output voltage is a lowest output voltage from the set that is higher than the first peak amplitude plus the headroom voltage and higher than the second peak amplitude plus the headroom voltage.

While this invention has been described with reference to illustrative embodiments, this description is not intended to be construed in a limiting sense. Various modifications and combinations of the illustrative embodiments, as well as other embodiments of the invention, will be apparent to persons skilled in the art upon reference to the description. It is therefore intended that the appended claims encompass any such modifications or embodiments.

What is claimed is:

1. A method, comprising:
   detecting a first peak amplitude in a first digital audio stream;
   selecting an output voltage at an output terminal of a converter such that the output voltage is a lowest output voltage from a set of output voltages, the set of output voltages comprising a plurality of voltage output values and each having a value higher than the first peak amplitude plus a headroom voltage;
   determining a first delay based on a settling time of the output voltage;
   converting the first digital audio stream into an analog audio signal;
   providing the analog audio signal to a speaker using a class-AB driver stage that receives power from the output terminal; and
   causing the analog audio signal to delay by the first delay such that the analog audio signal is provided to the speaker after the output voltage settles.

2. The method of claim 1, wherein causing the analog audio signal to delay by the first delay comprises inserting the first delay before converting the first digital audio stream into the analog audio signal.

3. The method of claim 1, further comprising providing the output voltage to the output terminal via an inductor.

4. The method of claim 3, wherein the inductor is coupled between a current path of a high-side transistor and a capacitor.

5. The method of claim 1, further comprising detecting a second peak amplitude in a second digital audio stream, wherein selecting the output voltage comprises selecting the output voltage such that the output voltage is the lowest output voltage from the set that is higher than the first peak amplitude plus the headroom voltage and that is higher than the second peak amplitude plus the headroom voltage.

6. The method of claim 1, further comprising receiving a battery voltage from a battery, wherein a highest voltage of the set is the battery voltage.

7. The method of claim 1, wherein causing the analog audio signal to delay by the first delay comprises gating a clock.

8. A method, comprising: detecting a first peak amplitude in a first digital audio stream; detecting a second peak amplitude in a second digital audio stream; selecting an output voltage at an output terminal of a converter such that the output voltage is a lowest output voltage from a set of output voltages, the set of output voltages comprising a plurality of voltage output values and each having a value higher than the first peak amplitude plus a headroom voltage and higher than the second peak amplitude plus the headroom voltage; determining a first delay based on a settling time of the output voltage; converting the first digital audio stream into a first analog audio signal; converting the second digital audio stream into a second analog audio signal; providing the first analog audio signal to a first speaker using a first class-AB driver stage that receives power from the output terminal; providing the second analog audio signal to a second speaker using a second class-AB driver stage that receives power from the output terminal; causing the first analog audio signal to delay by the first delay so that the first analog audio signal is provided to the first speaker after the output voltage settles; and causing the second analog audio signal to delay by the first delay.

9. The method of claim 8, further comprising receiving a battery voltage from a battery, wherein the set comprises the battery voltage.

10. The method of claim 8, wherein causing the first analog audio signal to delay by the first delay comprises inserting the first delay before converting the first digital audio stream into the first analog audio signal, and wherein causing the second analog audio signal to delay by the first delay comprises inserting the first delay before converting the second digital audio stream into the second analog audio signal.

11. The method of claim 8, further comprising receiving a battery voltage from a battery, wherein a highest voltage of the set is the battery voltage.

12. The method of claim 8, wherein the headroom voltage is 2 V or lower.

13. The method of claim 8, wherein the set comprises 6 V and 9 V.

14. The method of claim 8, wherein causing the first analog audio signal to delay by the first delay comprises gating a clock.

15. A device, comprising: a non-transitory memory storage comprising instructions; and a processor in communication with the non-transitory memory storage, the instructions, when executed by the processor, cause the processor to: detect a first peak amplitude in a first digital audio stream, select an output voltage of a converter such that the output voltage is a lowest output voltage from a set of output voltages, the set of output voltages comprising a plurality of voltage output values and each having a value higher than the first peak amplitude plus a headroom voltage, determine a first delay based on a settling time of the output voltage, convert the first digital audio stream into an analog audio signal, and provide the analog audio signal to a speaker using a class-AB driver stage with a delay time after the output voltage of the converter settles, wherein the class-AB driver stage receives power from the converter, and cause the analog audio signal to delay by the first delay such that the analog audio signal is provided to the speaker after the output voltage settles.

16. The device of claim 15, wherein the set comprises three output voltages.

17. The device of claim 16, wherein a first output voltage of the set is substantially equal to a battery voltage received by the converter.

18. The device of claim 15, wherein the headroom voltage is 2 V or lower.

19. The device of claim 15, wherein the instructions, when executed by the processor, cause the processor to: receive a second digital audio stream; and detect a second peak amplitude in the second digital audio stream, wherein selecting the output voltage of the converter comprises selecting the output voltage of the converter so that the output voltage is the lowest output voltage from the set that is higher than the first peak amplitude plus the headroom voltage and that is higher than the second peak amplitude plus the headroom voltage.

20. The device of claim 15, wherein selecting the output voltage of the converter comprises selecting the output voltage from the set using a 2-bit code or selecting the output voltage based on a look-up table (LUT) storing the set.

* * * * *